Feb. 26, 1974 CHANG-KYO KIM 3,794,527

THERMOELECTRIC CONVERTER

Filed Jan. 15, 1970

United States Patent Office 3,794,527

Patented Feb. 26, 1974

3,794,527

THERMOELECTRIC CONVERTER

Chang-Kyo Kim, McMurray, Pa., assignor to the United States of America as represented by the United States Atomic Energy Commission Filed Jan. 15, 1970, Ser. No. 3,183
Int. Cl. H01v *1/32*
U.S. Cl. 136—208 5 Claims

ABSTRACT OF THE DISCLOSURE

This invention relates in general to thermoelectric units and more particularly to a tubular thermoelectric unit which includes an array of tandemly arranged radially tapered annular thermoelectric pellets having insulation material of a lower density than the thermoelectric pellets positioned between each pellet.

BACKGROUND OF THE INVENTION

This invention pertains to tubular thermoelectric units, and more particularly to a new light weight, compact structure for tubular thermoelectric units.

In accordance with the prior art, there have been provided tubular thermoelectric units which are compact, extremely rugged, and reliable. Several problems arise, however, when these units are sought to be applied to space program applications. One of the critical problems is to reduce the systems weight so that a favorable specific power (watts per pound) can be obtained. Since the tubular thermoelectric converter weight is a substantial part of the overall system weight, any weight saving in the converter, that can be achieved, is desired.

The extreme ruggedness and reliability of the tubular thermoelectric units of the prior art have been derived from the unique fact that they are 100% compacted and void free and require neither a cover gas, nor any bonding at the hot and cold junctions. Any attempt at design changes to achieve a lighter weight thermoelectric circuitry must be able to maintain the aforementioned unique features.

Accordingly, it is the general object of this invention to provide a new and improved tubular thermoelectric unit.

It is a more particular object of this invention to provide a new and improved light-weight tubular thermoelectric unit that does not sacrifice the performance characteristics of older designs.

SUMMARY OF THE INVENTION

Briefly, the present invention accomplishes the above-cited objects by recognizing that the tubular thermoelectric converter configurations of the prior art, by the basic nature of their designs, employ more thermoelectric material than needed, because the cross-sectional area at the outside diameter of the thermoelectric pellets is larger than the cross-sectional area at the inside diameter of the thermoelectric pellets. Since a constant cross-sectional area of thermoelectric material from its inside diameter to its outside diameter is all that is required, considerable weight is saved by utilizing radially tapered annular thermoelectric pellets having linearly varying axial thicknesses formed so that the product of the pellet's innermost radius multiplied by its innermost thickness is substantially equal to the product of the pellet's outermost radius multiplied by its outermost thickness. Insulation fillers, made in the form of complementary radially tapering wafers to complement the thermoelectric pellets, are used to occupy the void area left by the new thermoelectric pellet design. The new thermoelectric design is still amenable to 100% compacted and void free assembly and fabrication procedures. An insulation filler material is employed having a density lower than that of the thermoelectric pellet material. Thus, resulting circuitry weight is lighter than conventional tubular units without sacrifice of performance characteristics.

BRIEF DESCRIPTION OF THE DRAWINGS

For a better understanding of an exemplary embodiment of this invention, reference may be had to the accompanying drawings, in which.

DESCRIPTION OF THE PREFERRED EMBODIMENT

Figure 1:
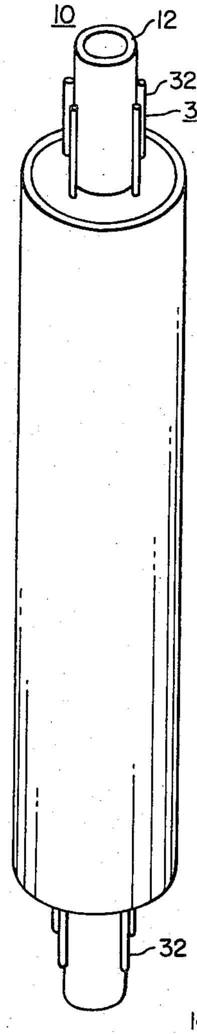
FIG. 1 is an isometric elevational view of a tubular thermoelectric generator constructed in accordance with the teachings of this invention.
Figure 2:
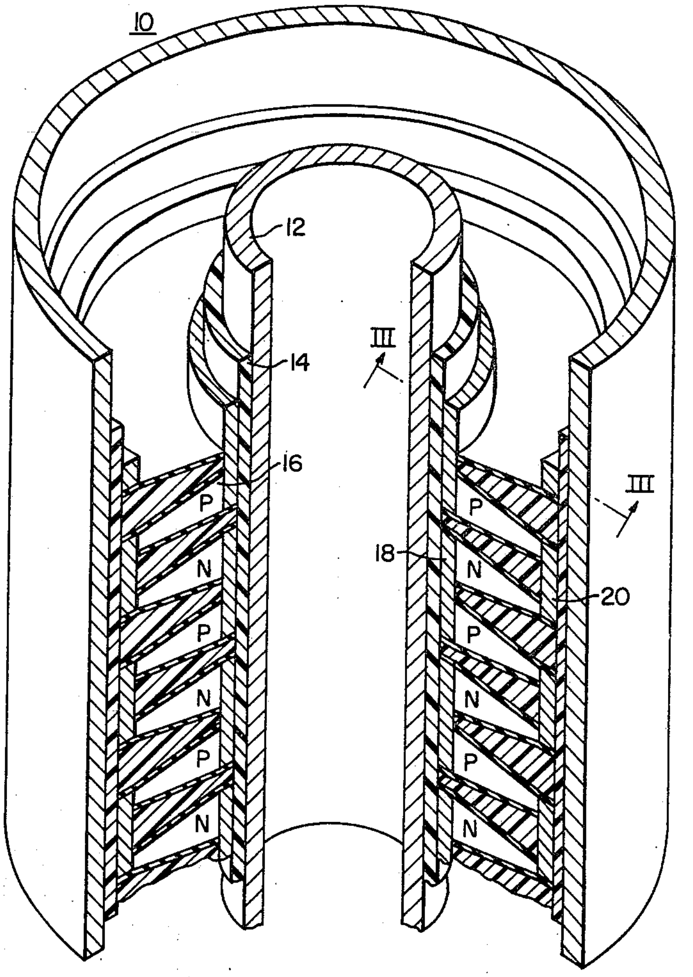
FIG. 2 is an isometric sectional view of a portion of the thermoelectric generator of FIG. 1.
Figure 3:
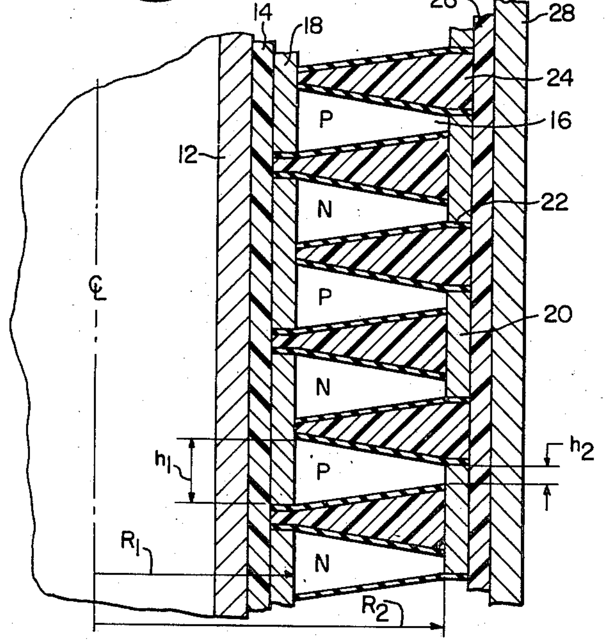
FIG. 3 is a longitudinal sectional view of a portion of the thermoelectric generator of FIG. 1 illustrative of the thermoelectric pellet design of FIG. 2 and is taken along the lines III—III thereof.

Referring now to the thermoelectric unit illustrated in FIGS. 1 through 3, it will be appreciated that a thermoelectric generator 10 constructed in accordance with the principles of this invention includes a central tubular conduit 12, desirably formed from a heat conductive metal such as Iconel, which serves as a central support for the thermoelectric generator 10. The conduit 12 is adapted to be connected to a high temperature source, for example a fluid such as a gas, or liquid metal, or an isotopic generator disposed within conduit 12 or in heat exchange relationship therewith. The heated fluid flows through the conduit 12 and heats conduit 12 to a temperature substantially equal to the temperature of the fluid. A relatively thin sleeve of electrical insulating material 14 desirably formed from a material which exhibits relatively good heat transfer capabilities such as boron nitride surrounds the sleeve 12. Positioned around the insulating sleeve 14 are a plurality of tandemly arranged thermoelectric pellets 16 which are of annular configuration and which receive the sleeve 14 in the central opening thereof. The pellets 16 are radially tapered so as to maintain a substantially constant thermoelectric cross-sectional area in the radial direction, having a linearly varying axial thickness that varies substantially in accordance with the equation $$h_1/h_2=R_2/R_1$$

where $h_1$ is the pellet's innermost axial height or thickness,
$h_2$ is the pellet's outermost axial height or thickness,
$R_1$ is the pellet's innermost radius, and
$R_2$ is the pellet's outermost radius.

The pellets 16 desirably are mounted axially in tandem and are alternately formed from thermoelectrically negative and thermoelectrically positive material. Electrical contacts alternately engage the inner and outer axial surfaces of the pellets so as to provide electrical communication between adjacent pellets in the tandem array. More particularly, a plurality of the electrically conductive contacts 18, of annular configuration, each having an outside radius equal to $R_1$ and which closely receive the sleeve 14 in the central opening thereof are desirably positioned between the sleeve 14 and the pellet 16 so as to provide good electrical contact between each thermoelectrically negative pellet and the adjacent thermoelectrically positive pellet directly below it. Similarly, a plurality of electrically conductive contacts 20, of annular configuration, each having an inside radius equal to $R_2$ and which closely receives the pellet 16 in the central opening thereof are desirably positioned so as to provide good electrical contact between each thermoelectrically positive pellet and the adjacent thermoelectrically negative pellet directly below it. A layer of insulation 22, such as mica insulation, is formed to cover the entire radial surfaces of each pellet so as to minimize the migration of doping material from one thermoelectric pellet to another. A plurality of insulation fillers 24 desirably designed in the form of radially tapering wafers, to complement the thermoelectric pellets 16, are constructed so as to occupy the void area between the thermoelectric pellets 16. By selecting an insulation filler material 24 whose density is lower than that of the thermoelectric pellet material 16, such as magnesium oxide, zirconium dioxide or mica material which has been compression molded, the resulting circuitry weight is lighter than that of conventional thermoelectric tubular units which employ annular thermoelectric pellets having a constant axial thickness. Positioned outwardly of thermoelectric pellets 16 and electrical contacts 20 and coextensive with sleeve 14 is a second electrical insulating sleeve 26 also formed from a good heat conductive material such as boron nitride, which closely receives pellets 16 and electrical contacts 20 in the opening thereof. An outer tubular protective sheath 28 closely receives the sleeve 26 therein and is desirably formed from metal similar to that of sleeve 12. Upper and lower terminal means 30 are provided for generator 10 with each terminal means 30 comprising a pair of spaced male conductors or prongs 32 with the upper prongs 32 being electrically connected to the upper thermoelectric pellets 16 and the lower prongs 32 being electrically connected to the lower thermoelectric pellets 16. Terminal means 30 does not form a part of this invention. For a more detailed view of suitable terminal means, reference may be had to the terminals shown and described in Pat. No. 3,481,794, patented Dec. 2, 1969, and entitled "Thermoelectric Device With Plastic Strain Inducing Means," by Kenneth Kasschau and assigned to Westinghouse Electric Corporation.

It will, therefore, be apparent that there has been disclosed a tubular thermoelectric converter of lesser weight than conventional tubular thermoelectric units without sacrifice in performance characteristics.

While there have been shown and described what are at present considered to be the preferred embodiments of the invention, modifications thereto will readily occur to those skilled in the art. It is not desired, therefore, that the invention be limited to the specific arrangements shown and described and it is intended to cover in the appended claims all such modifications as fall within the true spirit and scope of the invention.

I claim as my invention:

1. In a thermoelectric device comprising a pair of concentric tubular supporting members, a tandem array of linearly varying radially tapered annular thermoelectric pellets positioned between said supporting members, means for electrically insulating adjacent ones of said thermoelectric pellets and conductive means providing electrical contact between adjacent ones of said thermoelectric pellets to provide radial flow of current therethrough.

2. The thermoelectric device of claim 1 wherein said radially tapered annular thermoelectric pellets have a substantially linearly varying axial thickness, which substantially varies in accordance with the equation:

$$h_1/h_2=R_2/R_1$$

where $h_1$ is the pellet's innermost axial height or thickness,
$h_2$ is the pellet's outermost axial height or thickness,
$R_1$ is the pellet's innermost radius, and
$R_2$ is the pellet's outermost radius.

3. The thermoelectric device of claim 2 wherein said insulation means comprises complementarily tapered electrically insulating material positioned between said thermoelectric pellets, said electrically insulating material having a lower density than the material forming said thermoelectric pellets.

4. The thermoelectric device of claim 3 wherein said insulating material is selected from the group consisting of magnesium oxide, zirconium dioxide and mica material.

5. The thermoelectric device of claim 3, wherein said pair of concentric tubular supporting members comprises a tubular outer and inner supporting member, respectively, including a first sleeve of electrical insulating material engaging at least a portion of the inner surface of said outer supporting member, said tandem array of radially tapered annular thermoelectric pellets being disposed within said outer supporting member and positioned in juxtaposed relationship with said first insulating sleeve, a second tubular sleeve of insulating material engaging the surface of said pellets formed by the openings therein and said tubular inner supporting member being received within and engaging said second tubular insulating sleeve.

References Cited

UNITED STATES PATENTS

| | | | |
|---|---|---|---|
| 3,481,794 | 12/1969 | Kasschau | 136—208 |
| 3,400,452 | 9/1968 | Emley | 136—208 |
| 3,090,206 | 5/1963 | Anders | 136—204 |
| 3,266,258 | 8/1966 | Rosenfeld et al. | 62—3 |
| 3,533,854 | 10/1970 | Newton | 136—208 |

BENJAMIN R. PADGETT, Primary Examiner
H. E. BEHREND, Assistant Examiner

U.S. Cl. X.R.

136—205